United States Patent
Van Melick et al.

(10) Patent No.: US 6,777,284 B2
(45) Date of Patent: Aug. 17, 2004

(54) METHOD OF MANUFACTURING AN ELECTRONIC DEVICE

(75) Inventors: Nicolaas Gerardus Henricus Van Melick, Nijmegen (NL); Theodoor Gertrudis Silvester Maria Rijks, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/474,471
(22) PCT Filed: Apr. 10, 2002
(86) PCT No.: PCT/IB02/01308
  § 371 (c)(1),
  (2), (4) Date: Oct. 13, 2003
(87) PCT Pub. No.: WO02/084732
  PCT Pub. Date: Oct. 24, 2002

(65) Prior Publication Data
  US 2004/0106275 A1 Jun. 3, 2004

(30) Foreign Application Priority Data
  Apr. 13, 2001 (EP) .............................. 01201352

(51) Int. Cl.$^7$ ................................ H01L 21/20
(52) U.S. Cl. .................. 438/238; 438/52; 438/619; 438/381
(58) Field of Search .................. 438/48–53, 238, 438/381, 619

(56) References Cited

U.S. PATENT DOCUMENTS 6,355,551 B1 * 3/2002 Reinberg .................... 438/619

* cited by examiner

Primary Examiner—H. Jey Tsai
(74) Attorney, Agent, or Firm—Peter Zawilski

(57) ABSTRACT

The present invention provides a method of manufacturing an electronic device provided with metal regions, that are mutually separated by air spaces. In the method a first isolating layer, a seed layer and a second isolating layer are provided before applying metal regions. The seed layer and the second isolating layer are only removed after the provision of the metal regions. The method can be advantageously applied for the manufacture of a multilevel interconnect structure and for the manufacture of microelectromechanical elements.

9 Claims, 4 Drawing Sheets

METHOD OF MANUFACTURING AN ELECTRONIC DEVICE

The invention relates to a method of manufacturing an electronic device provided with metal regions that are mutually separated by air spaces, which method comprises the steps of fining a first isolating layer on a substrate surface;

depositing a metal seed layer so that it covers the first isolating layer and exposed areas of the substrate surface; and forming at least one metal region upon the exposed seed layer.

Such a method is known form U.S. Pat. No. 6,037,248. In this method there is preferably provided a plurality of isolating layers and metal regions, wherein the isolating layers are photoresist layers. Each forming of a metal region is followed by a polishing step, so as to remove the superfluous metal and the metal seed layer. Finally, the isolating layers are removed simultaneously.

It is a disadvantage of the known method that it is elaborate and uses a high number of metal deposition and processing steps to arrive at a final structure.

It is therefore a first object of the invention to provide a method of the kind mentioned in the opening paragraph, with a reduced number of processing steps to arrive at a final structure.

This object is realized in that a second patterned isolating layer is formed on the seed layer according to a second pattern, a perpendicular projection of which on the substrate surface has an overlap with the first isolating layer;

the metal regions are formed such that they fill the patterns defined by the first and the second isolating layers, and the second isolating layer and the seed layer are removed after forming of the metal regions, therewith obtaining the air spaces, the seed layer being removed in so far as it is not covered by the metal regions.

In the method of the invention a metal region is only formed after the provision of a first and a second isolating layer. Thereafter, or after providing further isolating layers and further level metal regions, the isolating layers are removed. In this removal the metal seed layer acts as etch stop layer. Hence, the number of metallisation steps and the number of polishing steps are cut to at least the half.

Although the number of removal steps increases, this is not dramatic, since etching is a well-controlled, clean and quick process step, especially compared to polishing. Besides, the method of the invention has the advantage that some of the isolating layers can be maintained if so desired. This allows the formation of functional entities within the structure of metal regions that are mutually separated with air spaces.

In a first embodiment the first isolating layer is removed after removal of the seed layer. In this embodiment a structure equal to the known structure is obtained. This embodiment is in particular advantageous if the pattern formed in the first isolation layer includes contact holes or vias extending to the substrate surface. The capacitive coupling between the vias that have to transmit signals individually, is then reduced.

In a second embodiment the first isolating layer is not removed, but maintained. In a preferred case a metallisation layer is present under the first isolating layer. This allows the definition of elements such as thin-film capacitors in the structure. It is therefore advantageous that the first isolating layer has a high dielectric constant, for example a relative dielectric constant of 7.0 or more. Materials that have such a dielectric constant are for instance $Si_3N_4$, $Ta_2O_5$, $BaZrTiO_3$. Other materials are known to the person skilled in the art. Other elements are for instance two-layer inductors. Therewith it is advantageous that the first isolating layer contains a material with a high magnetic susceptibility, such as ferrites, composites with ferrite particles, and the like.

In a further embodiment the method comprises before removal of the second isolating layer the steps of:

forming a third patterned isolating layer on the metal regions;

depositing an additional metal seed layer so that it covers the third patterned isolating layer and exposed areas of the metal regions;

forming a fourth patterned isolating layer on the additional seed layer according to a fourth pattern;

forming second level metal regions upon the exposed seed layer, so as to fill the pattern defined by the third and the fourth isolating layers; and removing the fourth isolating layer, the additional metal seed layer, in so far as the seed layer is not covered by the formed second level metal regions, and the third isolating layer.

In this embodiment a multilevel structure is provided. Such a multilevel structure can be used as an interconnect structure for an integrated circuit.

It is advantageous if in the multilevel structure a microelectromechanical element is defined. Therein the element comprises:

a first electrode in the metallisation layer;

a second electrode in a second level metal region, which second electrode faces the first electrode and is substantially free-standing, such that it is movable towards the first electrode; and at least one via extending from the second level metal regions to the metal regions, the via providing an electrical connection and mechanical support, a perpendicular projection of the metal region on the metallisation layer substantially non-overlapping with the first electrode.

Micro-electromechanical elements are known per se, for example from WO-A 01/61848. They are proposed for instance as switches and tunable capacitors for applications in the RF domain. With this embodiment, such elements may be manufactured as discrete elements, be provided in passive networks, or inside an interconnect structure of an integrated circuit. Therewith the seed layer can be used as an etch stop layer, that protects the underlying first isolating layer. Preferably the first isolating layer is not removed, but maintained so as to act as dielectric layer. The element is in that case a tunable capacitor of which the tuning range is enhanced considerably, in comparison with an embodiment without dielectric layer. Alternatively, The first isolating layer may be chosen so as to act as a protecting and/or anti-sticking layer. It could then even contain conductive particles. This is suitable if the element is to be used as a switch.

In the embodiment of the multilevel structure, it is preferred that the second and third isolating layers are removed in a single step. It is therefore preferred that these isolating layers contain the same material, which is a photoresist by preference. The seed layers are removed in another removal step. The removal preferably takes place by means of etching. If the seed layers contain the same material as the metal regions, such as copper, or if the etchant for the seed layers also etches the metal regions, it is preferred that the definition of the patterns is modified thereto, i.e. the patterns are designed larger so as to allow a size reduction during the removal steps.

The multilevel structure formed may be present on a planarized substrate. Alternatively, the substrate may contain cavities, wherein the multilevel structure is provided. Such structure can be used to provide a cap on top of the structure. Also the sidewalls of such a structure may provide additional mechanical strength. Further on, spacers and a capping layer may be present on the substrate to provide a cover for the multilevel structure. The capping layer may be provided on top of the metal regions before the removal of the isolating layers and the one or more seed layers. In that case it must be etch resistant against the etchants used. A suitable combination is for instance a ceramic or silicon oxide capping layer, with polymeric photoresists and copper metal layers.

The invention is described further hereinafter, by way of example only, with reference to the accompanying drawings in which:

FIGS. 1–4 illustrate four steps in a semiconductor metallization process embodying the present invention;

FIGS. 5–8 demonstrates similar steps in accordance with a further processing stage, according to an embodiment of the present invention;

Before turning to the particular embodiments described in relation to the drawings, it should be appreciated that the present invention can advantageously provide for a manner of processing back-end contacts and metallization layers by way of a single metallization step. For example, first the contact holes are patterned. This can be done in an isolating low-k dielectric material or a photo resist layer, or any other material with comparable properties, which can be removed in a later stage. On top of this patterned layer a metal seed layer is deposited. Then, the metallization layer is patterned on the same way like the contact holes. Hereafter, the seed layer is used to selectively grow the metal until the contact holes and the metallization layers are sufficiently filled. This process can be used again to define the following contact-metal interconnecting layer. After all the contact-metal interconnection layers are defined, the top isolating layer, defining the metal-interconnects, can be selectively removed. Next the thin seed layer is removed selectively and then the underlying isolating layer, defining the contact holes, has to be removed again. This has to be repeated for every contact-metal stage grown, resulting in a complete interconnect stack with air as the dielectric material.

This process is now described in detail.

Figure 1:
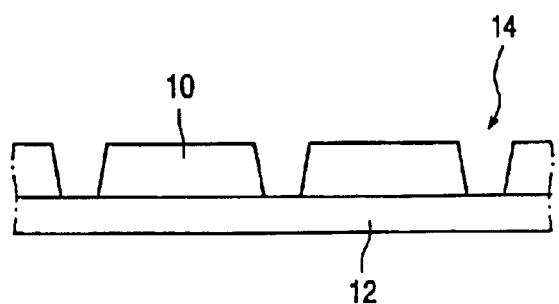

Turning first to FIG. 1 there is illustrated an initial step in a process embodying the present invention in which a patterned first isolation layer 10 has been provided on a substrate 12. The first isolation layer 10 can comprise a photoresist material, a dielectric material or indeed any other appropriate material with comparable properties and, in the present illustrated example, the first isolation layer 10 has been patterned so as to include contact holes 14 which extend down to the substrate 12.

Figure 2:
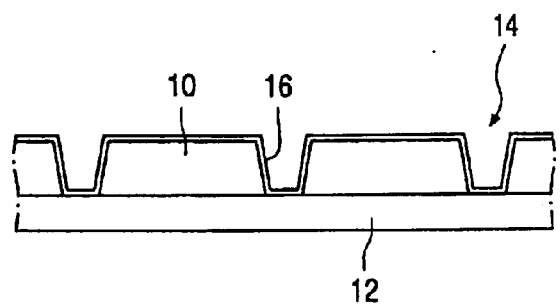

With regard to FIG. 2, there is illustrated a next step in this embodiment in which a metal seed layer 16 is deposited on top of the first isolation layer 10 and in the contact holes 14. This seed layer 16 serves as a conductive seed layer for subsequent metal growth which can, for example, be based on metal standard plating techniques.

Figure 3:
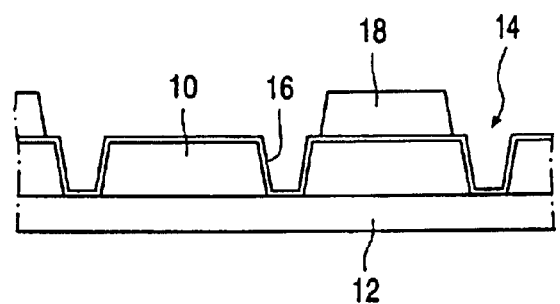

With regard to FIG. 3, the next step in this embodiment of the present invention involves the formation of a second patterned isolating layer 18 which is formed on the aforementioned seed layer 16. This second isolating layer 18 is patterned in the illustrated embodiment so that only isolated portions remain located on portions of the first isolation layer 10 which have remained subsequent to the patterning of the said first isolation layer 10.

The formation of the first and second isolation layers 10, 18 and the seed layer 16 in this manner provides for a particularly advantageous feature of the present invention in that it will be appreciated that the remaining regions of the second isolation layer 18 serve to cover underlying regions of the seed layer 16 to prevent subsequent metal growth on such covered regions.

The metallization, such as the formation of a metal layer formed by standard metal plating techniques, is conducted so as to selectively grow the metal upon those regions of the seed layer 16 which will remain accessible by the electrolyte material. This is illustrated in FIG. 4 and, from the above discussion in relation to FIG. 3, it will be appreciated that the metal therefore grows within the contact holes 14 and also serves to form metal lines 20 extending between the contact holes 14.

Figure 4:
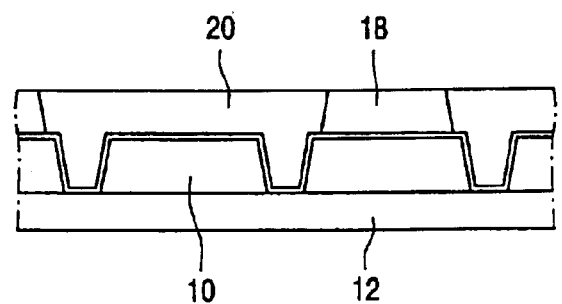

As will be appreciated, due to the structure formed and as illustrated in FIG. 3, no metal growth occurs on the upper surface of the remaining regions of the second patterned isolating layer 18 and so the growth of the metal illustrated in FIG. 4 serves to effectively fill the contact holes 14 and also the regions which will serve to define metal lines providing for contact between the metal grown in the contact holes 14. As illustrated in FIG. 4, the contact holes and metal line regions are advantageously filled in a self-aligned manner such that it can be readily possible to avoid incorporating a separate planarisation step in order to achieve the metallized structure illustrated in FIG. 4. This serves to simplify the semiconductor Metallization process embodying the present invention.

The isolating layers can, if required, be removed at this stage such that a shallow stack structure comprising the deposited metal 20 remains.

However, the steps according to as illustrated in FIGS. 1–4 above can be effectively repeated so that a further set of first and second isolation layers—again with a seed layer formed therebetween, are formed on the structure illustrated on FIG. 4.

Figure 5:
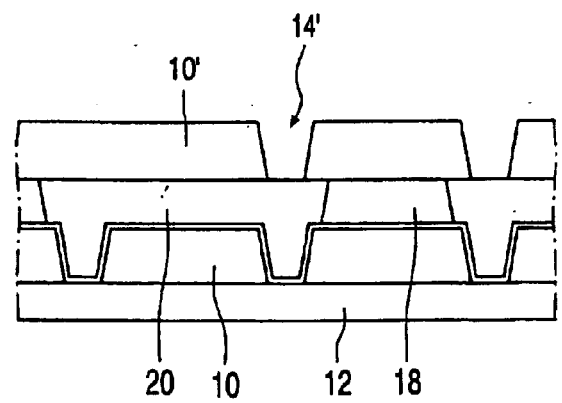
Figure 6:
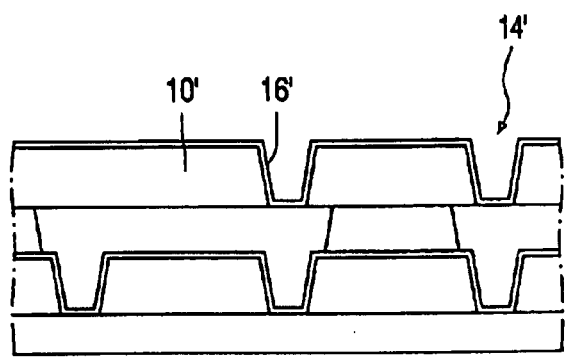

This is illustrated with reference to FIG. 5 in which a third isolating layer 10' is formed and patterned so as to provide a further set of contact holes 14' and, subsequently, as illustrated in FIG. 6, a further metal seed layer 16' is formed on top of this third isolating layer 10' and in the contact holes 14'.

Figure 7:
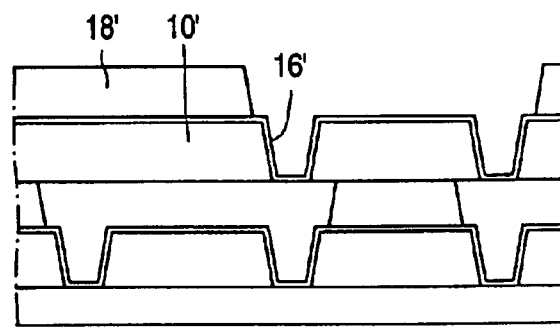
Figure 8:
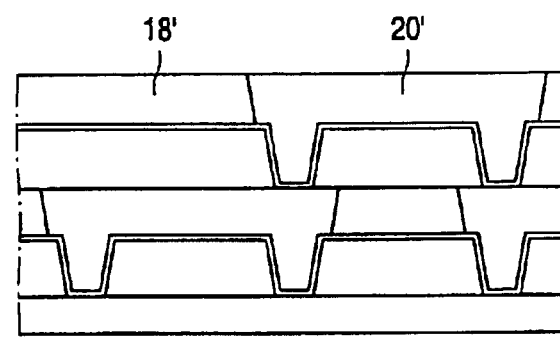

As illustrated in FIG. 7, the fourth isolating layer 18' is formed and patterned on the seed layer 16' so as to remain as illustrated in FIG. 7 and, as with the step illustrated in FIG. 4, this further structure defined by this further set of third 10' and fourth 18' isolating layers is then subjected to a standard metal plating technique. As illustrated in FIG. 8, such a further single metallization step leads to the formation of metal in the further contact holes 14' and also provides for second level metal regions 20' as before. As will be appreciated, the metal layer is again grown where the seed layer is in contact with the electrolyte and again, this further metallization structure is formed in an advantageously self-aligned manner not necessarily requiring an additional planarisation step to arrive at the structure illustrated in FIG. 8.

The steps illustrated in FIGS. 9–13 relate to the removal of the two sets of first and second isolating layers.

Figure 9:
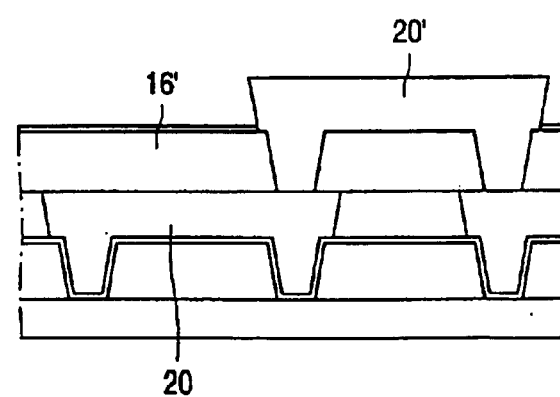
FIGS. 9–13 illustrate five further steps that can be employed subsequent to the steps of FIGS. 5–8.
Figure 10:
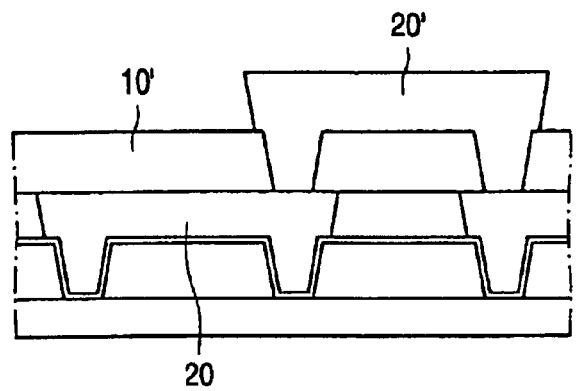

With reference first to FIG. 9, the upmost, i.e. fourth or even further isolating layer 18' can be removed by any standard technique until exposing the seed layer 16' which serves to shield the underlying portion of the third isolating layer 10'. This bare seed layer portion is selectively removed so as to expose the underlying third isolating layer 10'. It will of course be appreciated that the removal of the seed layer also effects the metallization structure since it consists of effectively the same material. However, the amount of material that is removed to sufficiently strip the seed layer, and thus the corresponding amount that is removed from the metallization structure, will not have any significant influence on the resulting metal structure.

Figure 11:
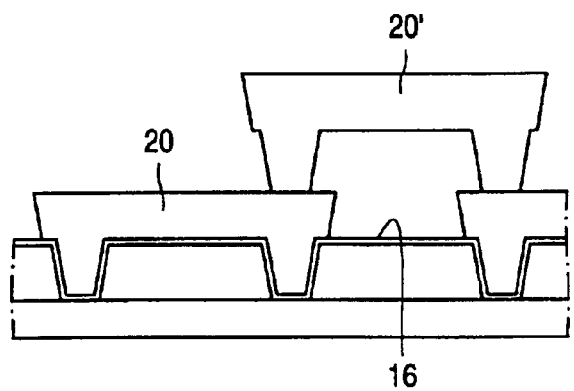

Subsequent to removal of the further seed layer 16', the said third isolation layer 10' and the underlying second isolating layer 18 of the first set of layers are then removed until the initial seed layer 16 shielding the underlying initial first isolation layer 10 is then exposed as illustrated in FIG. 11.

Figure 12:
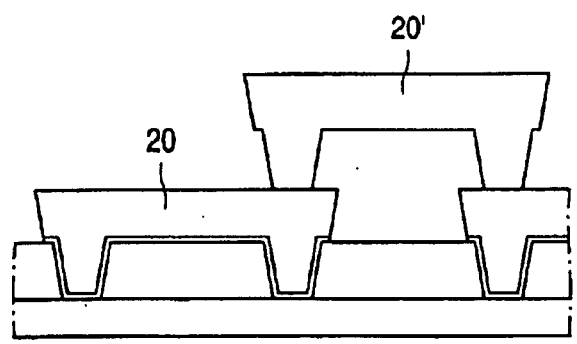

Again, the exposed initial seed layer 16 is selectively removed as illustrated in FIG. 12 so as to expose the initial first isolation layer 10 as illustrated in Step 12.

Figure 13:
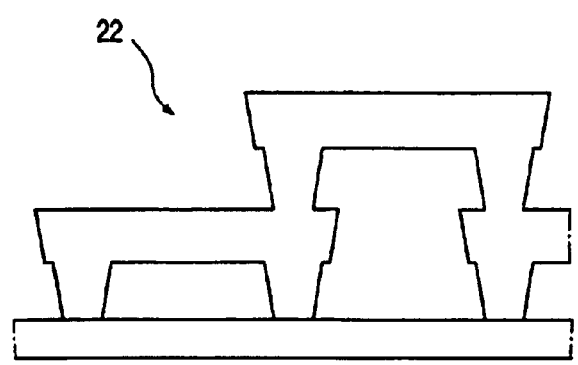

The removal of this initial first isolation layer 10 leads to a final metallization stack structure 22 which is illustrated formed on the substrate 12 in FIG. 13.

This resulting structure comprises a complete metallization stack consisting solely of metal and with air being available as the ultimate isolating dielectric.

As will be appreciated, the set of steps illustrated in FIGS. 1–4 and then again in FIGS. 5–8, as required, can be repeated to form an even more elaborate stacked interconnect structure then that illustrated in FIG. 13. In any case, it should be appreciated that for each contact hole layer and metal interconnect layer, only one metallization step is required such that, for the structure illustrated in FIG. 13, only two such Metallization steps were required to arrive at the metallization stack illustrated.

That is, first a lithographic step is employed to pattern a contact level in the structure then, subsequent to the application of the seed layer, a second lithographic step can then be employed to pattern the so-called interconnect-metal layer which is then grown in a self-aligned manner since the seed layer is covered at the areas where it is desired to prevent metal growth.

Figure 14:
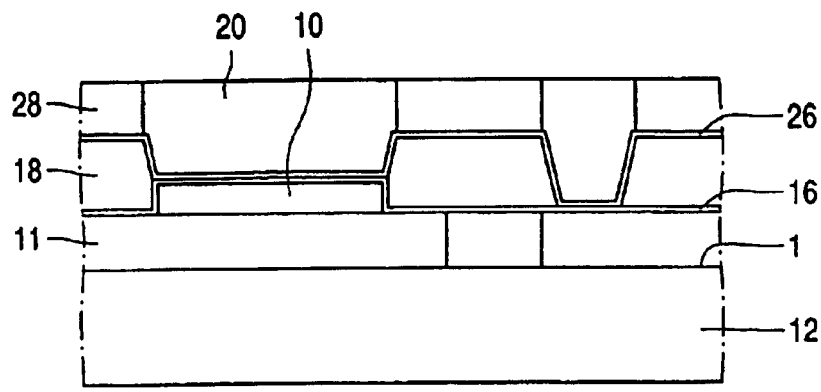
FIG. 14 shows a diagrammatical cross-sectional view of a step in a second embodiment of the method of the invention.
Figure 15:
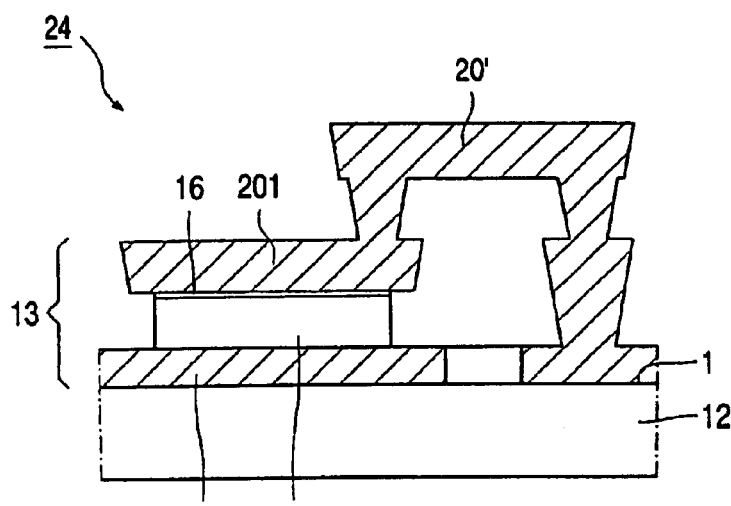
FIG. 15 shows a diagrammatical cross-sectional view of the device resulting from the second embodiment.

FIG. 14 shows a cross-sectional drawing of a stage in another embodiment of the method of the invention. FIG. 15 shows the resulting device 24. In the method a metallisation layer 11 has been defined at the surface 1 of the substrate 12. After deposition and patterning of the metallisation layer, the resulting substrate is planarized. However, this is not necessary. Thereafter the first isolation layer 10 has been deposited, for example with Chemical-Vapour Deposition. The first isolation layer 10 is patterned so that it is only present where a capacitor 13 is to be defined. Thereafter the seed layer 16 is applied. This seed layer 16 seals the first isolation layer 10 and is present on areas of the metallisation layer 11 that are exposed. The second isolation layer 18 being a photoresist is provided thereon by means of spin-coating. The metal regions 20 can now be grown, for instance with electroplating. However, it is preferred as shown in FIG. 14 that an additional seed layer 26 and an additional second isolation layer 28 are applied. The additional seed layer 26 is applied without being patterned. The additional second isolation layer 28 is patterned according to the same pattern as the second isolation layer 18, i.e. no additional photolithographic mask is required.

After growing the metal regions 20 non-shown third and fourth isolating layers 10', 18', a non-shown further seed layer 16' and second level metal regions 20' are provided. This is realized as described with reference to the FIGS. 5–8. Thereafter, the second, third and fourth isolating layers 18, 28, 10' and 18' and the seed layers 16, 26, 16' are removed by means of etching.

FIG. 15 shows a cross-sectional diagrammatic view of the resulting device 24. Therein, a capacitor 13 is present with a first electrode 111 in the metallisation layer and a second electrode 201 in a metal region. The first isolating layer 10 is present as dielectricum between the electrodes 111, 201.

Figure 16:
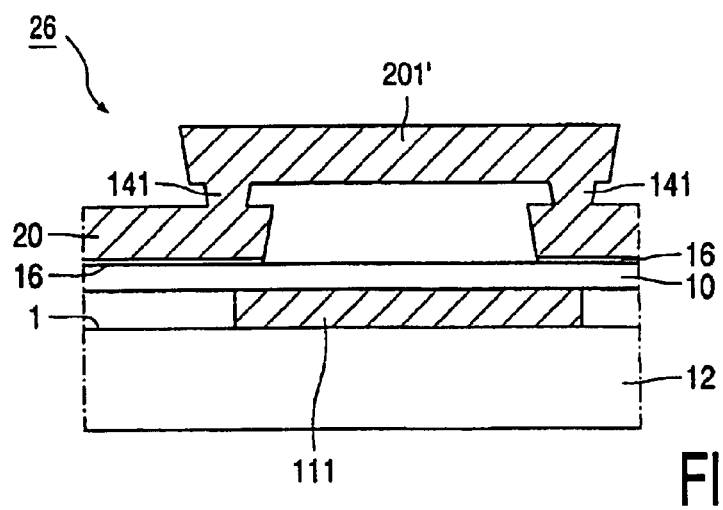
FIG. 16 shows a diagrammatical cross-sectional view of a device resulting from a third embodiment of the invention.

FIG. 16 shows a cross-sectional diagrammatic view of another device 26 that is manufactured with the method of the invention. According to this embodiment, a metallisation layer 11 is provided on the surface 1 of the substrate 12. Subsequently the first isolation layer 10, and the seed layer 16 are provided. After providing the non-shown second isolation layer metal regions 20 are formed. After growing the metal regions 20 not-shown third and fourth isolating layers 10', 18', a further seed layer 16' and second level metal regions 20' are provided. This is realized as described with reference to the FIGS. 5–8. Thereafter, the second, third and fourth isolating layers 18, 28, 10' and 18' and the seed layers 16, 26, 16' are removed by means of etching. As a result a micro-electromechanical element is defined with a first electrode 111 and a second electrode 201'. This second electrode 201' faces the first electrode 111, i.e. a perpendicular projection of the second electrode 201' on the metallisation layer 11 substantially overlaps with the first electrode 111. Further on, it is substantially free-standing, such that it is movable towards the first electrode 111. This is realized in an adequate patterning of the fourth isolation layer, i.e. in the direction perpendicular to the plane of the drawing the second electrode 201' extends to an extent that the vias 141 do not. These vias 141 extend from the second level metal regions 20' to the regions 20. The metal regions 20 are such defined that a perpendicular projection of the metal region 20 on the metallisation layer 11 lets the first electrode 111 substantially free.

What is claimed is:

1. A method of manufacturing an electronic device provided with metal regions, that are mutually separated by air spaces, which method comprises the steps of:

forming a patterned first isolating layer on a substrate surface;

depositing a metal seed layer so that it covers the first isolating layer and exposed areas of the substrate surface; and forming metal regions upon the exposed seed layer;

characterised in that a second patterned isolating layer is formed on the seed layer according to a second pattern, a perpendicular projection of which on the substrate surface has an overlap with the first isolating layer;

the metal regions are formed such that they fill the patterns defined by the first and the second isolating layers, and the second isolating layer and the seed layer are removed after forming of the metal regions, therewith obtaining the air spaces, the seed layer being removed in so far as it is not covered by the metal regions.

2. A method according to claim 1, characterized in that after removal of the seed layer the first isolating layer is removed.

3. A method according to claim 1, characterized in that a metallisation layer is applied before forming the first patterned isolating layer.

4. A method according to claim 3, characterized in that a capacitor is formed with a first electrode in the metallisation layer, a second electrode in a metal region and the first isolating layer as an intermediate dielectricum having a relative dielectric constant larger than 7.0.

5. A method according to claim 1, characterized in that before removal of the second isolating layer it comprises the steps of:

forming a third patterned isolating layer on the metal regions;

depositing an additional metal seed layer so that it covers the third patterned isolating layer and exposed areas of the metal regions;

forming a fourth patterned isolating layer on the additional seed layer according to a fourth pattern;

forming second level metal regions upon the exposed seed layer, so as to fill the pattern defined by the third and the fourth isolating layers; and removing the fourth isolating layer, the additional metal seed layer, in so far as the seed layer is not covered by the formed second level metal regions, and the third isolating layer.

6. A method according to claim 5, characterized in that a micro-electromechanical element is defined, the element comprising:

a first electrode in the metallisation layer;

a second electrode in a second level metal region, which second electrode faces the first electrode and is substantially free-standing, such that it is movable towards the first electrode; and at least one via extending from the second level metal regions to the metal regions, the via providing an electrical connection and mechanical support, a perpendicular projection of the metal region on the metallisation layer substantially non-overlapping with the first electrode.

7. A method according to claim 5, characterized in that the second and third isolating layer are removed in a single step.

8. A method according to claim 1, characterized in that the pattern formed in the first isolation layer includes contact holes or vias extending to the substrate surface.

9. A method according to claim 1, characterized in that the substrate comprises a plurality of semiconductor elements.

* * * * *